(12) United States Patent
Lee et al.

(10) Patent No.: US 8,187,960 B2
(45) Date of Patent: May 29, 2012

(54) METHOD OF JOINING AND METHOD OF FABRICATING AN ORGANIC LIGHT EMITTING DIODE DISPLAY DEVICE USING THE SAME

(75) Inventors: Jae-Seob Lee, Suwon-si (KR); Kyu-Sung Lee, Suwon-si (KR); Hyo-Jin Kim, Suwon-si (KR); Jae-Kyeong Jeong, Suwon-si (KR); Jin-Ho Kwack, Suwon-si (KR)

(73) Assignee: Samsung Mobile Display Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/227,091

(22) Filed: Sep. 7, 2011

(65) Prior Publication Data

US 2011/0315314 A1    Dec. 29, 2011

Related U.S. Application Data

(62) Division of application No. 12/219,380, filed on Jul. 21, 2008, now Pat. No. 8,016,628.

(30) Foreign Application Priority Data

Jul. 19, 2007    (KR) .................. 10-2007-0072199

(51) Int. Cl.
*H01L 21/8238* (2006.01)
*H01L 21/30* (2006.01)
(52) U.S. Cl. ........ 438/584; 438/68; 438/455; 156/273.3
(58) Field of Classification Search .................. 438/455, 438/456, 68; 156/273.3
See application file for complete search history.

(56) References Cited

U.S. PATENT DOCUMENTS

| | | | |
|---|---|---|---|
| 2,559,864 A | 7/1951 | Firth | |
| 2,961,354 A | 11/1960 | Cleveland | |
| 5,407,856 A | 4/1995 | Quenzer et al. | |
| 5,418,002 A | 5/1995 | Paik et al. | |
| 5,915,193 A | 6/1999 | Tong et al. | |
| 5,938,104 A | 8/1999 | Saxelby, Jr. et al. | |
| 5,996,594 A | 12/1999 | Roy et al. | |
| 6,131,795 A | 10/2000 | Sato | |
| 6,180,496 B1 | 1/2001 | Farrens et al. | |
| 6,765,249 B2 | 7/2004 | Voutsas et al. | |
| 6,774,435 B1 | 8/2004 | Matsumoto et al. | |
| 6,787,885 B2 | 9/2004 | Esser et al. | |
| 6,911,666 B2 | 6/2005 | Voutsas | |
| 6,949,403 B2 | 9/2005 | Xiao et al. | |
| 7,087,134 B2 | 8/2006 | Chen et al. | |
| 7,326,313 B2 | 2/2008 | Lee et al. | |
| 2003/0188553 A1 | 10/2003 | Mann et al. | |
| 2004/0121568 A1 | 6/2004 | Kim et al. | |
| 2005/0001201 A1 | 1/2005 | Bocko et al. | |
| 2005/0061423 A1 | 3/2005 | Kohayashi | |

(Continued)

FOREIGN PATENT DOCUMENTS

CN    1 711 000 A    12/2005

(Continued)

*Primary Examiner* — Joseph L Williams
(74) *Attorney, Agent, or Firm* — Lee & Morse, P.C.

(57) ABSTRACT

A method of joining a flexible layer and a support includes forming a first metal layer on one surface of the flexible layer, forming a second metal layer on one surface of the support, cleaning the first metal layer and the second metal layer, and joining the first metal layer to the second metal layer, such that the first metal layer is between the flexible layer and the second metal layer.

8 Claims, 3 Drawing Sheets

U.S. PATENT DOCUMENTS

| | | |
|---|---|---|
| 2005/0214551 A1 | 9/2005 | Aida |
| 2006/0085965 A1 | 4/2006 | Suga et al. |
| 2006/0093838 A1 | 5/2006 | Kohayashi et al. |
| 2006/0115672 A1 | 6/2006 | De Gryse et al. |
| 2006/0135028 A1 | 6/2006 | Klyszcz |
| 2006/0148129 A1 | 7/2006 | Lim et al. |
| 2006/0207967 A1 | 9/2006 | Bocko et al. |
| 2006/0234472 A1 | 10/2006 | Gabriel et al. |
| 2008/0311361 A1 | 12/2008 | Lee et al. |

FOREIGN PATENT DOCUMENTS

| | | |
|---|---|---|
| CN | 1 750 925 A | 3/2006 |
| JP | 10-289895 | 10/1998 |
| JP | 11-165951 A | 6/1999 |
| JP | 2000-311781 A | 11/2000 |
| JP | 2000-353797 | 12/2000 |
| JP | 2002-192651 | 7/2002 |
| JP | 2002-324969 | 11/2002 |
| JP | 2004-006707 A | 1/2004 |
| JP | 2004-144970 | 5/2004 |
| JP | 2004-191463 | 7/2004 |
| JP | 2004-533717 A | 11/2004 |
| JP | 2005-064243 | 3/2005 |
| JP | 2005-256061 | 9/2005 |
| JP | 2005-347438 | 12/2005 |
| JP | 2006-123425 | 5/2006 |
| JP | 2006-202989 A | 8/2006 |
| KR | 10-1998-0081324 A | 11/1998 |
| KR | 10-2002-0038324 A | 5/2002 |
| KR | 10-2004-0108705 A | 12/2004 |
| KR | 10-2005-0022953 A | 3/2005 |
| KR | 10-2005-0081059 A | 8/2005 |
| KR | WO 2005/076756 A3 | 8/2005 |
| KR | 10-2005-0104812 A | 11/2005 |
| KR | 10-2006-0028537 A | 3/2006 |
| KR | 10-0571848 B1 | 4/2006 |
| KR | 10-2006-0041206 A | 5/2006 |
| KR | 10-2006-0041609 A | 5/2006 |
| KR | 10-2006-0052336 A | 5/2006 |
| KR | 10-2006-0063607 A | 6/2006 |
| KR | 10-2006-0088562 A | 8/2006 |
| WO | WO 2005/076756 A2 | 8/2005 |
| WO | WO 2007/060314 A1 | 5/2007 |

METHOD OF JOINING AND METHOD OF FABRICATING AN ORGANIC LIGHT EMITTING DIODE DISPLAY DEVICE USING THE SAME

CROSS-REFERENCE TO RELATED APPLICATIONS

This is a divisional application based on application Ser. No. 12/219,380, filed Jul. 21, 2008 now U.S. Pat. No. 8,016,628, the entire contents of which is hereby incorporated by reference.

The present application is related to U.S. Pat. No. 7,950,567 B2, issued May 31, 2011, which matured from application Ser. No. 12/137,353, filed Jun. 11, 2008, entitled Organic Light Emitting Diode Display Device and Method of Fabricating the Same, said Ser. No. 12/137,353, having been co-pending with parent Ser. No. 12/219,380. application Ser. No. 12/137,353 is incorporated by reference herein in its entirety.

BACKGROUND OF THE INVENTION

1. Field of the Invention

Embodiments of the present invention relate to a method of joining and to a method of fabricating an organic light emitting diode (OLED) display device. More particularly, embodiments of the present invention relate to a method of joining a flexible layer and a support by using metal therebetween and to a method of fabricating an OLED display device using the same.

2. Description of the Related Art

Flexible flat panel display devices, e.g., an OLED display device, refer to display devices that may bend to a certain extent by applying a predetermined tension, thereby adjusting a viewing angle. Flexible flat panel display devices may include stationary or portable devices, e.g., devices in armbands, wallets, notebook computers, and so forth.

A conventional flexible flat panel display device may include a flexible substrate. During fabrication of the conventional flexible flat panel display device, a support may be attached to the flexible substrate via an organic adhesive to control the flexible substrate. The organic adhesive between the flexible substrate and the support, however, may cause contamination during the manufacturing process of the flexible flat panel display device, e.g., contamination of a process chamber, so processing time may be increased due to required cleaning, e.g., of the contaminated process chamber. In addition, use of the organic adhesive may limit a process temperature to about 300° C. or less. Further, uniform application of the organic adhesive between the flexible substrate and the support may be difficult, so the flexible substrate and the support may not be uniformly adhered to each other.

SUMMARY OF THE INVENTION

Embodiments of the present invention are therefore directed to a method of joining and to a method of fabricating an OLED display device, which substantially overcome one or more of the disadvantages of the related art.

It is therefore a feature of an embodiment of the present invention to provide a method of joining a flexible layer to a support via metal in a simplified process.

It is another feature of an embodiment of the present invention to provide a method of joining a flexible layer to a support via metal with a high process yield.

It is yet another feature of an embodiment of the present invention to provide a method of joining a flexible layer to a support via metal with reduced production costs.

It is still another feature of an embodiment of the present invention to provide a method of joining a flexible layer to a support via metal while exhibiting reduced temperature dependency.

It is yet another feature of an embodiment of the present invention to provide a method of fabricating an OLED display device by using a method of joining a flexible substrate to a support having one or more of the above features.

At least one of the above and other features and advantages of the present invention may be realized by providing a method of joining a flexible layer and a support, including forming a first metal layer on one surface of the support, forming a second metal layer on one surface of the flexible layer, cleaning the first metal layer and the second metal layer, and joining the second metal layer to the first metal layer, such that the second metal layer is between the flexible layer and the first metal layer.

Cleaning the first and second metal layers may include a first cleaning step, the first cleaning step including drying the first and second metal layers after immersion thereof in a cleaning fluid, a second cleaning step, the second cleaning step including cleaning the first and second metal layers via a D-sonic process or a rinsing process in deionized water, and a third cleaning step, the third cleaning step being substantially similar to the first cleaning step. The first and second metal layers may be formed of one or more of iron, nickel, tin, zinc, chromium, cobalt, silicon, magnesium, titanium, zirconium, aluminum, silver, copper, and an alloy thereof. Joining the first and second metal layers may include a first joining process, the first joining process including positioning the first and second metal layers adjacent to each other at room temperature, an intermediate cleaning process, the intermediate cleaning process including cleaning the first and second metal layers via a D-sonic process or a rinsing process in deionized water, and drying the first and second metal layers using isopropyl alcohol, and a second joining process, the second joining process including pressing and annealing the first and second metal layers to each other.

The method may further include treating the first and second metal layers with hydrogen fluoride after the cleaning and before the joining. Cleaning the first and second metal layers may include a first cleaning step, the first cleaning step including drying the first and second metal layers after immersion thereof in a cleaning fluid, a second cleaning step, the second cleaning step including cleaning the first and second metal layers via a D-sonic process or a rinsing process in deionized water, and a third cleaning step, the third cleaning step being substantially similar to the first cleaning step. The first and second metal layers may be formed of one or more of iron, nickel, tin, zinc, chromium, cobalt, silicon, magnesium, titanium, zirconium, aluminum, silver, copper, and an alloy thereof. Joining the first and second metal layers may include a first joining process, the first joining process including positioning the first and second metal layers adjacent to each other at room temperature and a second joining process, the second joining process including pressing and annealing the first and second metal layers to each other.

At least one of the above and other features and advantages of the present invention may be realized by providing a method of joining a method of fabricating an OLED display device, including forming a first metal layer on one surface of the support, forming a second metal layer on one surface of the flexible layer, cleaning the first metal layer and the second metal layer, joining the second metal layer to the first metal layer, such that the second metal layer is between the flexible layer/and the first metal layer; forming an OLED on the flexible layer, such that the flexible layer is between the OLED and the support, the OLED including a first electrode, an organic layer having an emitting layer, and a second electrode, and removing the support with the first and second metal layers.

Cleaning the first and second metal layers may include a first cleaning step, the first cleaning step including drying the first and second metal layers after immersion thereof in a cleaning fluid, a second cleaning step, the second cleaning step including cleaning the first and second metal layers via a D-sonic process or a rinsing process in deionized water, and a third cleaning step, the third cleaning step being substantially similar to the first cleaning step. The first and second metal layers may be formed of one or more of iron, nickel, tin, zinc, chromium, cobalt, silicon, magnesium, titanium, zirconium, aluminum, silver, copper, and an alloy thereof Joining the first and second metal layers may include a first joining process, the first joining process including positioning the first and second metal layers adjacent to each other at room temperature, an intermediate cleaning process, the intermediate cleaning process including cleaning the first and second metal layers via a D-sonic process or a rinsing process in deionized water, and drying the first and second metal layers using isopropyl alcohol, and a second joining process, the second joining process including pressing and annealing the first and second metal layers to each other. Each of the first and second metal layers may be formed to a thickness of about 1,000 angstroms to about 10,000 angstroms.

The method may further include treating the first and second metal layers with hydrogen fluoride after the cleaning and before the joining. Cleaning the first and second metal layers may include a first cleaning step, the first cleaning step including drying the first and second metal layers after immersion thereof in a cleaning fluid, a second cleaning step, the second cleaning step including cleaning the first and second metal layers via a D-sonic process or a rinsing process in deionized water, and a third cleaning step, the third cleaning step being substantially similar to the first cleaning step. Each of the first and second metal layers may be formed to a thickness of about 1,000 angstroms to about 10,000 angstroms. The first and second metal layers may be formed of one or more of iron, nickel, tin, zinc, chromium, cobalt, silicon, magnesium, titanium, zirconium, aluminum, silver, copper, and an alloy thereof. Joining the first and second metal layers may include a first joining process, the first joining process including positioning the first and second metal layers adjacent to each other at room temperature and a second joining process, the second joining process including pressing and annealing the first and second metal layers to each other.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Korean Patent Application No. 10-2007-0072199, filed on Jul. 19, 2007, in the Korean Intellectual Property Office, and entitled: "Joining Method and Method of Fabricating Organic Light Emitting Diode Display Device Using the Same," is incorporated by reference herein in its entirety.

Embodiments of the present invention will now be described more fully hereinafter with reference to the accompanying drawings, in which exemplary embodiments of the invention are illustrated. Aspects of the invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers, elements, and regions may be exaggerated for clarity of illustration. It will also be understood that when a layer or element is referred to as being "on" another layer, element, or substrate, it can be directly on the other layer, element, or substrate, or intervening layers and/or elements may also be present. Further, it will also be understood that when a layer or element is referred to as being "between" two layers or elements, it can be the only layer or element between the two layers or elements, or one or more intervening layers and/or elements may also be present. In addition, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like reference numerals refer to like elements throughout.

As used herein, the expressions "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C" and "A, B, and/or C" includes the following meanings: A alone; B alone; C alone; both A and B together; both A and C together; both B and C together; and all three of A, B, and C together. Further, these expressions are open-ended, unless expressly designated to the contrary by their combination with the term "consisting of." For example, the expression "at least one of A, B, and C" may also include an nth member, where n is greater than 3, whereas the expression "at least one selected from the group consisting of A, B, and C" does not.

Figure 1A:
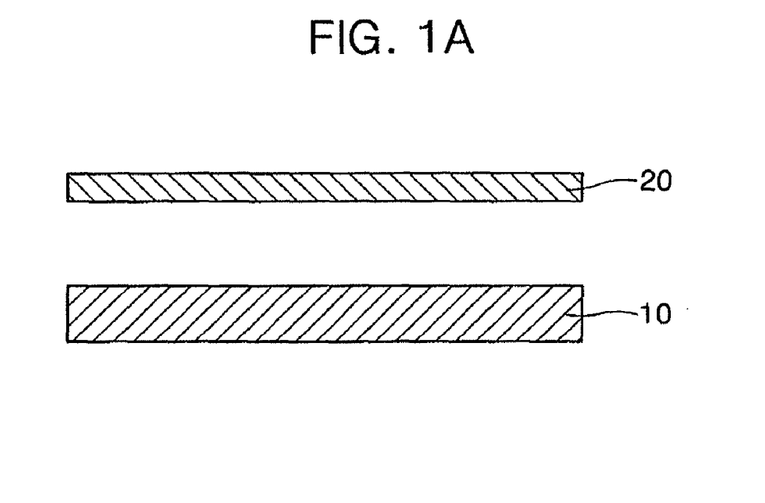
FIGS. 1A-1C illustrate cross-sectional views of sequential stages in a method of joining a flexible layer to a support according to an embodiment of the present invention.
Figure 1B:
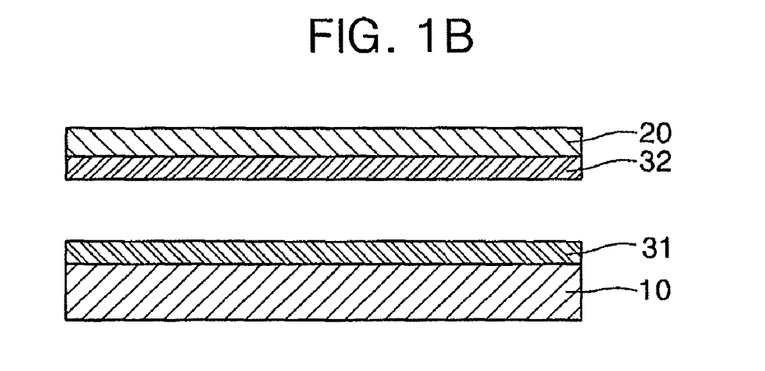
Figure 1C:
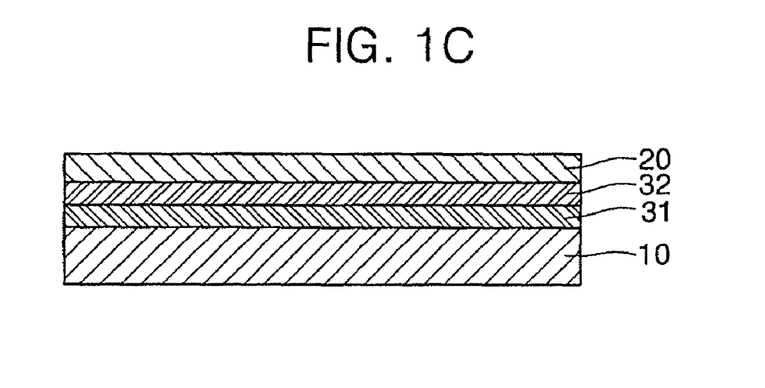

FIGS. 1A-1C illustrate cross-sectional views of sequential stages in a method of joining a flexible layer to a support according to an embodiment of the present invention. For example, the flexible layer may function as a flexible substrate in a flexible flat panel display device, e.g., an OLED display device.

Referring to FIG. 1A, a support 10 and a flexible layer 20 may be provided. The support 10 may have a predetermined strength to facilitate control of the flexible layer 20 during subsequent processes. The support 10 may be formed of, e.g., one or more of metal, glass, silicon, and quartz.

The flexible layer 20 may have excellent thermal stability, and may be formed of a material exhibiting characteristics of a diffusion barrier with respect to moisture and oxygen. For example, the flexible layer 20 may be formed of plastic, stainless steel (STS), thin metal film, and/or ultra-thin glass. The flexible layer 20 may have a thickness of about 0.1 mm or less.

Referring to FIG. 1B, a first metal layer 31 may be formed on a surface of the support 10 to form a first stacked structure. Similarly, a second metal layer 32 may be formed on a surface of the flexible layer 20 to form a second stacked structure. The first and second metal layers 31 and 32 may be formed by any suitable method.

Formation of the first and second metal layers 31 and 32 on the support 10 and flexible layer 20, respectively, may substantially minimize surface roughness of the support 10 and flexible layer 20, so adhesion between the support 10 and flexible layer 20 in subsequent processes may be improved. In other words, the first and second metal layers 31 and 32 may prevent or substantially minimize non-uniform joining of the support 10 and the flexible layer 20 by minimizing surface roughness thereof. Also, the first and second metal layers 31 and 32 may be formed on respective surfaces of the support 10 and the flexible layer 20, i.e., surfaces facing one another, so grinding the respective surfaces of the support 10 and the flexible layer 20 may be substantially omitted during joining of the support 10 and the flexible layer 20 in subsequent processes.

Each of the first and second metal layers 31 and 32 may have a thickness of about 1,000 angstroms to about 10,000 angstroms, e.g., about 1,000 angstroms. A metal layer having a thickness that is too low may have poor surface roughness, so joining of the support 10 and the flexible layer 20 may be difficult. A metal layer having a thickness that is too thick, may damage the flexible layer 20 due to non-reversible force generated during detachment of the support 10 and the flexible layer 20. Therefore, a thickness of about 1,000 angstroms to about 10,000 angstroms of the first and second metal layers 31 and 32 may provide uniform attachment between the support 10 and the flexible layer 20 in subsequent processes despite the surface roughness of the support 10 and the flexible layer 20. Thus, excessive production cost and time may be prevented.

Each of the first and second metal layers 31 and 32 may be formed of a material having a low melting point in order to facilitate a direct joining between the support 10 and the flexible layer 20, e.g., via annealing, in a subsequent process. The first and second metal layers 31 and 32 may include one or more of iron (Fe), nickel (Ni), tin (Sn), zinc (Zn), chromium (Cr), cobalt (Co), magnesium (Mg), titanium (Ti), zirconium (Zr), aluminum (Al), silver (Ag), copper (Cu), and an alloy thereof.

Once the first and second metal layers 31 and 32 are formed on the support 10 and on the flexible layer 20, respectively, by-products and/or foreign substances generated during formation of the first and second metal layers 31 and 32 may be removed by an initial cleaning process. The initial cleaning process may include one or more steps of cleaning, e.g., immersing the first and second metal layers 31 and 32 in any suitable cleaning fluid, followed by drying. For example, the initial cleaning process may include three cleaning steps. It is noted, however, that, e.g., a single-step initial cleaning process, two-step initial cleaning process, and so forth, are within the scope of the present invention.

In the first cleaning step of the initial cleaning process, by products and foreign substances may be removed from the first and second metal layers 31 and 32 using, e.g., a stripper. For example, each of the support 10 with the first metal layer 31 and the flexible layer 20 with the second metal layer 32 may be immersed in a cleaning fluid, e.g., deionized (DI) water or an organic cleaning liquid, and may be subsequently dried using, e.g., isopropyl alcohol (IPA).

In the second cleaning step of the initial cleaning process, the first and second metal layers 31 and 32 may be cleaned by a D-sonic method or by a rinsing method. The D-sonic method may include immersing each of the support 10 with the first metal layer 31 and the flexible layer 20 with the second metal layer 32 in DI water, while cleaning via high frequency sonic energy. The rinsing method may include rotating the support 10 with the first metal layer 31 and the flexible layer 20 with the second metal layer 32, while spraying the support 10 with the first metal layer 31 and the flexible layer 20 with the second metal layer 32 with DI water.

In the third cleaning step of the initial cleaning process, the first and second metal layers 31 and 32 may be cleaned using, e.g., a stripper. For example, each of the support 10 with the first metal layer 31 and the flexible layer 20 with the second metal layer 32 may be immersed in a cleaning fluid, e.g., deionized (DI) water or an organic cleaning liquid, and may be subsequently dried using, e.g., isopropyl alcohol (IPA). The third cleaning step may be substantially the same as the first cleaning step.

Once the initial cleaning process of the first and second metal layers 31 and 32 is complete, each of the first and second metal layers 31 and 32 may be annealed at a temperature of about 100° C. to about 140° C. The annealing process may completely remove the cleaning fluid used in the initial cleaning process to clean the first and second metal layers 31 and 32.

Referring to FIG. 1C, a joining process may be performed by joining the first and second stacked structures illustrated in FIG. 1B via the first and second metal layers 31 and 32. In other words, outer surfaces of the first and second metal layers 31 and 32 may be joined, such that the support 10 and the flexible layer 20 may be connected via the first and second metal layers 31 and 32 to form, e.g., a multi-layered structure, as illustrated in FIG. 1C. The joining process may include first and second joining steps.

In the first joining step, the support 10 with the first metal layer 31 and the flexible layer 20 with the second metal layer 32 may be placed in a class 100 clean room, such that the first metal layer 31 and the second metal layer 32 may be adjacent to each other. For example, the first and second metal layers 31 and 32 may be arranged in parallel and close proximity to each other. It is noted that the class 100 clean room refers to a processing chamber maintaining a controlled environment in terms of airborn particles and temperature, so the temperature is maintained at about room temperature and the particles therein are in an amount of about one hundred particles in a 30×30×30 cm$^3$ air space. Once the first and second metal layers 31 and 32 are arranged in the clean room, the first and second metal layers 31 and 32 may be joined by a chemical bond, e.g., a weak hydrogen bond, to form a stacked structure of support 10/first metal layer 31/second metal layer 32/flexible layer 20, as illustrated in FIG. 1C.

Once the first and second metal layers 31 and 32 are joined by the first joining step, the first and second metal layers 31 and 32 may be cleaned by an intermediate cleaning process in two cleaning steps. In the first step of the intermediate cleaning process, the D-sonic or rinsing method described previously with reference to the second cleaning step of the initial cleaning process may be used. In the second step of the intermediate cleaning process, the joined support 10 and flexible layer 20 may be dried after the first step of the intermediate cleaning process using, e.g., IPA. By the first and second steps of the intermediate cleaning processes, water and bubbles adsorbed between the surfaces of the first and second metal layers 31 and 32 may be removed.

Once the joined first and second metal layers 31 and 32 are cleaned and dried, the second joining step may be performed by pressing and annealing the first and second metal layers 31 and 32. While the first and second metal layers 31 and 32 are weakly joined by a hydrogen bond in the first joining step, the second joining process may increase the bonding strength between the first and second metal layers 31 and 32. In particular, as joining density between the first and second metal layers 31 and 32 is increased by applied heat and pressure, a distance between the first and second metal layers 31 and 32 may decrease and a metallic bond may be formed between the first and second metal layers 31 and 32 to directly join them together. Consequently, a distance between the support 10 and the flexible layer 20 after the second joining step may be decreased at least about 5-fold, as compared to a distance between the support 10 and the flexible layer 20 after the first joining step and before the second joining step. For example, while a distance between the first and second metal layers 31 and 32 after the first joining step, i.e., due to the hydrogen bonding, may be about 20 angstroms to about 30 angstroms, a distance between the first and second metal layers 31 and 32 after the second joining process, i.e., due to the metal bonding, may be about 3 angstroms to about 4 angstroms. Therefore, joining strength may be also increased as compared to the joining strength immediately after the first joining step.

In the second joining step, the pressure applied to the support 10 and the flexible layer 20 may be in a range of about 0.1 MPa to about 50 MPa. For example, the pressure may be about 0.5 MPa. A pressure above about 50 MPa may damage the support 10 and the flexible layer 20, and a pressure below about 0.1 MPa may be insufficient to provide high adhesion between the support 10 and the flexible layer 20. Further, in the second joining step, an annealing temperature for optimizing pressure and strength of the adhesion between the support 10 and the flexible layer 20 may be about 200° C. to about 600° C., e.g., about 400° C. to about 450° C. The annealing time may be about 0.5 hours to about 2 hours, e.g., about 0.5 hours.

According to another embodiment of the present invention, a method of joining a flexible layer with a support may be substantially similar to the method described previously with reference to FIGS. 1A-1C, with the exception of performing hydrogen fluoride (HF) treatment on the first and second metal layers 31 and 32 after the initial cleaning process in order to make outer surfaces of the first and second metal layers 31 and 32 hydrophobic. Due to the HF treatment of the first and second metal layers 31 and 32, gases, e.g., oxygen, may be removed from the first and second metal layers 31 and 32, so the intermediate cleaning process for removing bubbles and water may be omitted. Thus, the HF-treated first and second metal layers 31 and 32 may be joined by a chemical bond through the first joining process, as described previously with reference to FIG. 1C, and may be directly joined by a metallic bond having a high adhesion in the second joining process, as further described with reference to FIG. 1C.

According to another embodiment illustrated in FIGS. 2A-2E, a method of fabricating an OLED display device may include joining the support 10 and the flexible layer 20. A method of joining the support 10 and the flexible layer 20 may be either of the methods described previously, e.g., with reference to FIGS. 1A-1C.

Figure 2A:
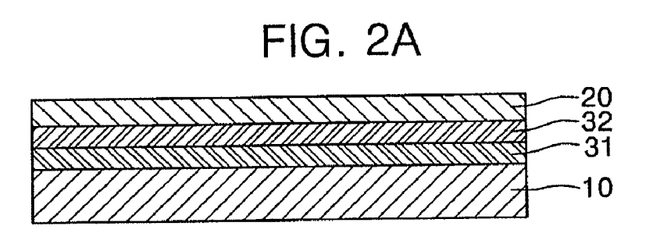
FIGS. 2A-2E illustrate cross-sectional views of sequential stages in a method of fabricating an OLED display device according to an embodiment of the present invention.

Referring to FIG. 2A, the flexible layer 20 may be formed on the support 10, such that the first and second metal layers 31 and 32 may be therebetween. The method of joining the support 10 to the flexible layer 20 may be substantially similar to the method described previously, e.g., with reference to FIGS. 1A-1C, and therefore will not be repeated.

Figure 2B:
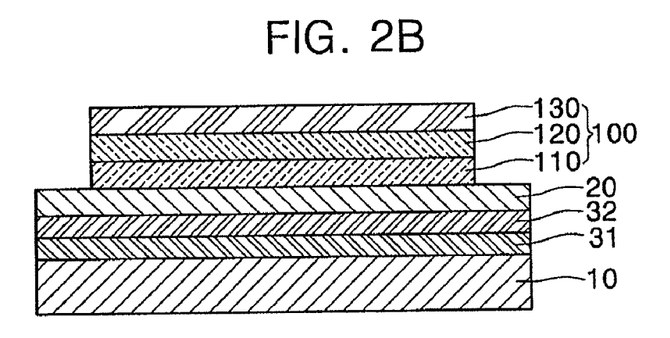

Referring to FIG. 2B, an OLED 100 may be formed on the flexible layer 20, such that the flexible layer 20 may be between the OLED 100 and the support 10. The OLED 100 may include a first electrode 110, an organic layer 120, and a second electrode 130 formed sequentially on the flexible layer 20, as further illustrated in FIG. 2B. A thin film transistor (not shown), a capacitor (not shown), or an insulating layer (not shown) may be further included between the first electrode 110 and the flexible layer 20.

The first electrode 110 may have a double-structure or a triple-structure to include a reflective layer. For example, if the first electrode 110 has a double-structure, the first electrode 110 may include a sequentially stacked reflective layer, e.g., a layer including aluminum (Al), silver (Ag), or an alloy thereof, and a transparent conductive layer, e.g., a layer including indium-tin-oxide (ITO), indium-zinc-oxide (IZO), indium-tin-zinc-oxide (ITZO), or a combination thereof. In another example, if the first electrode 110 has a triple-structure, the first electrode 110 may include a sequentially stacked first metal layer, e.g., a layer including titanium (Ti), molybdenum (Mo), ITO, or an alloy thereof, a reflective layer, e.g., a layer including Al, Ag, or an alloy thereof, and a transparent conductive layer, e.g., a layer including ITO, IZO, ITZO, or a combination thereof.

The organic layer 120 may include an organic light emitting layer. The organic light emitting layer may include one or more of a white emitting layer, a red emitting layer, a green emitting layer, and a blue emitting layer. Further, the organic layer 120 may include at least one of a hole injection layer, a hole transport layer, an electron injection layer, an electron transport layer, and a hole blocking layer. The organic layer 120 may be formed by, e.g., vacuum deposition, ink-jet printing, or laser induced thermal imaging (LITI).

If the organic layer 120 includes a white emitting layer, the white emitting layer may be a single layer or a multi-layer. When the white emitting layer is a single layer, white light may be emitted by mixing materials emitting different colors with different dopants. For example, white emitting layer having a single layer may include PBD, TPB, Coumarin 6, DCM1, and Nile red with a carbazole molecule, i.e., PVK, at an appropriate ratio. Alternatively, white light may be emitted by mixing two different color-emitting materials and adding the remaining emitting material thereto. For example, a white emitting layer having a single layer may include a red emitting material mixed with a green emitting material, followed by addition of a blue emitting material. The red emitting material may be formed of a polymer, e.g., polythiophene (PT) and derivatives thereof, the green emitting material may be formed of low-molecular materials, e.g., an aluminum quinoline complex ($Alq_3$), $BeBq_2$, and/or Almq, and/or a polymer, e.g., poly(p-phenylenevinylene) (PPV) and derivatives thereof, and the blue emitting material may be formed of low-molecular materials, e.g., ZnPBO, Balq, DPVBi and OXA-D, and/or polymers, e.g., polyphenylene (PPP) and derivatives thereof.

When the white emitting layer is a multi-layer, the white emitting layer may be formed to include, e.g., two layers emitting light in different wavelength regions. For example, one layer, e.g., a phosphorescent emitting layer, may emit light in an orange-red region and another layer, e.g., a fluorescent emitting layer, may emit light in a blue region. It is noted that the phosphorescent emitting layer may have excellent emission characteristics, as compared with a fluorescent emitting layer emitting light in a substantially same wavelength range, while the fluorescent emitting layer may have better lifetime characteristics than the phosphorescent emitting layer. Thus, the white emitting layer formed by stacking the phosphorescent emitting layer emitting light in the orange-red region and the fluorescent emitting layer emitting light in the blue region may have excellent luminous efficiency and long lifetime. Also, the white emitting layer may be a double layer formed of a polymer, a low-molecular material, and/or a combination thereof.

When the white emitting layer is a multi-layer, the white emitting layer may have a triple structure. For example, the white emitting layer may include a red emitting layer, a green emitting layer, and a blue emitting layer. The red, green, and blue emitting layers may emit lights of respective colors, and may be stacked in any order. The red emitting layer may be formed of a low molecular material, e.g., $Alq_3$ (host)/DCJTB (fluorescent dopant), $Alq_3$ (host)/DCM (fluorescent dopant), or CBP (host)/PtOEP (phosphorescent organic metal complex), or of a polymer, e.g., a PFO series polymer. The green emitting layer may be formed of a low molecular material, e.g., $Alq_3$, $Alq_3$ (host)/C545t (dopant), or CBP (host)/IrPPY (phosphorescent organic material complex), or of a polymer, e.g., PFO series polymer or a PPV series polymer. The blue emitting layer may include a host and a dopant, wherein the host may include one or more of an amine series compound, e.g., TMM-004(COVION), 3-(4-tert-butylphenyl)-4-phenyl-5-(4-biphenylspiro)-6P, a PFO series polymer, and a PPV series polymer, and the dopant may include one or more of distyrylbenzene (DSB), distyrylarylene (DSA), bis[2-(4,6-difluorophenyl)pyridinato-N,C2']iridium picolinate (F2Irpic), and tris[1-(4,6-difluorophenyl)pyrazolate-N,C2'] iridium ($Ir[dfppz]_3$).

The hole injection layer of the organic layer 120 may facilitate hole injection into the organic emitting layer of the organic layer 120, and may increase the lifetime of the OLED 100. The hole injection layer may be formed of an arylamine series compound or starburst amines, and examples of hole injection layer materials may include one or more of 4,4,4-tris(3-methylphenylamino) triphenylamine (m-MTDATA), 1,3,5-tris[4-(3-methylphenylamino)phenyl]benzene (m-MTDATB), and copper phthalocyanine (CuPc).

The hole transport layer of the organic layer 120 may be formed of an arylene diamine derivative, a starburst compound, a biphenyl diamine derivative having a Spiro group, or a trapezoidal compound. Examples of materials used to form the hole transport layer may include one or more of N,N-diphenyl-N,N-bis(4-methylphenyl)-1,1-biphenyl-4,4-diamine (TPD) or 4,4-bis[N-(1-naphthyl)-N-phenylamino]biphenyl (NPB).

The hole blocking layer of the organic layer 120 may prevent transfer of a hole into the electron injection layer when hole mobility is greater than electron mobility in the organic emitting layer. The hole blocking layer may be formed of, e.g., 2-biphenyl-4-yl-5-(4-biphenyl)-1,2,4-triazole (TAZ).

The electron transport layer may be formed of a metal compound that may receive an electron from a cathode electrode and stably transfer the electron, e.g., e.g., $Alq_3$. The electron injection layer may be formed of, e.g., one or more of 1,3,4-oxyldiazole derivatives, 1,2,4-triazole derivatives, and LiF.

The second electrode 130 of the OLED 100 may be a semi-transmissive electrode, and may be formed of, e.g., magnesium silver (MgAg) or aluminum silver (AlAg). For example, MgAg may be formed by co-deposition of Mg and Ag, and AlAg may be formed by sequentially depositing Al and Ag. Further, a transparent conductive layer, e.g., ITO or IZO, may be further formed on the second electrode 130.

Figure 2C:
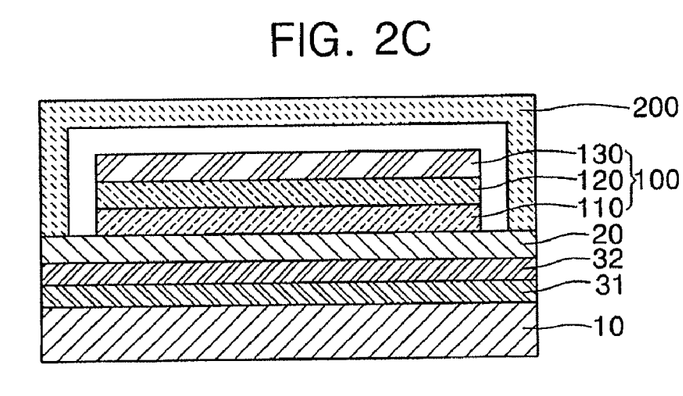

Referring to FIG. 2C, an encapsulation substrate 200 may be formed on the flexible layer 20 to surround the OLED 100, such that the OLED 100 may be completely enclosed from an exterior. In other words, the encapsulation substrate 200 may protect the OLED 100 from moisture and/or external air. The encapsulation substrate 200 may be formed of transparent glass or plastic to transmit light emitted from the OLED 100. The encapsulation substrate 200 and the flexible layer 20 may be adhered by a sealant or a frit.

Figure 2D:
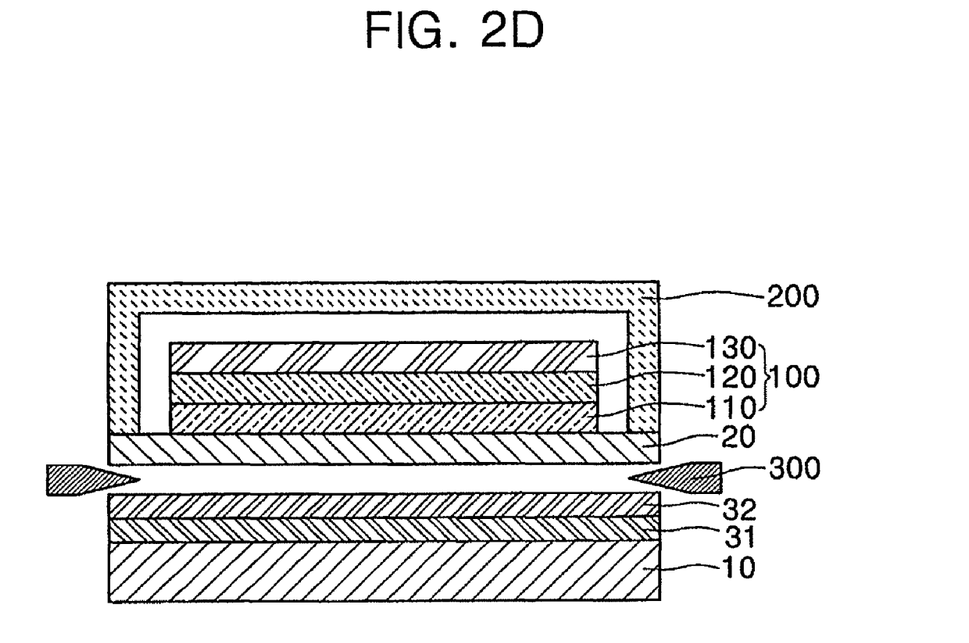

Referring to FIG. 2D, once the OLED 100 is enclosed between the flexible layer 20 and the encapsulation substrate 200, the flexible layer 20 may be detached from the support 10 using detachment equipment 300, e.g., a razor blade. As illustrated in FIG. 2D, the detachment equipment 300 may be used along an interface between the flexible layer 20 and the second metal layer 32, so the support 10 and the first and second metal layers 131 and 132 may be completely removed.

Figure 2E:
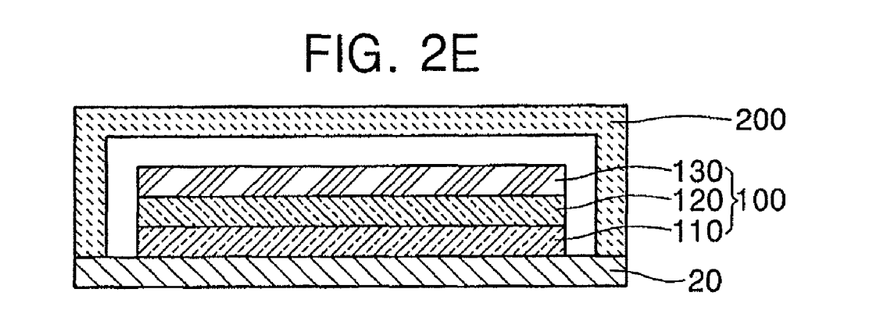

Accordingly, as illustrated in FIG. 2E, the support 10 and the flexible layer 20 are separated from each other. Thus, an OLED display device according to an exemplary embodiment of the present invention may include a flexible substrate, i.e., the flexible layer 20.

Embodiments of the present invention may be advantageous in providing a method of joining a flexible layer to a support by using metal layers therebetween. Use of the metal layers may eliminate use of an organic adhesive, so organic contamination may be eliminated and temperature dependency may be reduced. Further, use of the metal layers may minimize surface roughness of the flexible layer and the support, so uniformity adhesion and strength between the flexible layer and the support may be increased. As such, manufacturing time and costs may be reduced, while manufacturing yield may be increased. Further the manufacturing process may be simplified. Accordingly, manufacturing of an OLED display device with a flexible substrate according to embodiments of the present invention may be substantially improved in terms of manufacturing process and costs.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of joining a flexible layer and a support, comprising:
   forming a first metal layer on one surface of the support;
   forming a second metal layer on one surface of the flexible layer;
   cleaning the first metal layer and the second metal layer; and
   joining the second metal layer to the first metal layer, such that the second metal layer is between the flexible layer and the first metal layer.

2. The method as claimed in claim 1, wherein cleaning the first and second metal layers includes:
   a first cleaning step, the first cleaning step including drying the first and second metal layers after immersion thereof in a cleaning fluid;
   a second cleaning step, the second cleaning step including cleaning the first and second metal layers via a D-sonic process or a rinsing process in deionized water; and
   a third cleaning step, the third cleaning step being substantially same as the first cleaning step.

3. The method as claimed in claim 1, wherein the first and second metal layers are formed of one or more of iron, nickel, tin, zinc, chromium, cobalt, silicon, magnesium, titanium, zirconium, aluminum, silver, copper, and an alloy thereof.

4. The method as claimed in claim 1, wherein joining the first and second metal layers includes:

a first joining process, the first joining process including positioning the first and second metal layers adjacent to each other at room temperature;

an intermediate cleaning process, the intermediate cleaning process including cleaning the first and second metal layers via a D-sonic process or a rinsing process in deionized water, and drying the first and second metal layers using isopropyl alcohol; and a second joining process, the second joining process including pressing and annealing the first and second metal layers to each other.

5. The method as claimed in claim 1, further comprising treating the first and second metal layers with hydrogen fluoride after the cleaning and before the joining.

6. The method as claimed in claim 5, wherein cleaning the first and second metal layers includes:

a first cleaning step, the first cleaning step including drying the first and second metal layers after immersion thereof in a cleaning fluid;

a second cleaning step, the second cleaning step including cleaning the first and second metal layers via a D-sonic process or a rinsing process in deionized water; and a third cleaning step, the third cleaning step being substantially same as the first cleaning step.

7. The method as claimed in claim 5, wherein the first and second metal layers are formed of one or more of iron, nickel, tin, zinc, chromium, cobalt, silicon, magnesium, titanium, zirconium, aluminum, silver, copper, and an alloy thereof.

8. The method as claimed in claim 5, wherein joining the first and second metal layers includes:

a first joining process, the first joining process including positioning the first and second metal layers adjacent to each other at room temperature; and a second joining process, the second joining process including pressing and annealing the first and second metal layers to each other.

\* \* \* \* \*